(12) United States Patent
Melanson

(10) Patent No.: US 7,656,687 B2
(45) Date of Patent: Feb. 2, 2010

(54) MODULATED TRANSFORMER-COUPLED GATE CONTROL SIGNALING METHOD AND APPARATUS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 271 days.

(21) Appl. No.: 11/954,202

(22) Filed: Dec. 11, 2007

(65) Prior Publication Data

US 2009/0147544 A1    Jun. 11, 2009

(51) Int. Cl.
*H02M 3/335* (2006.01)
*H02M 5/40* (2006.01)

(52) U.S. Cl. .............................. 363/34; 363/20; 363/15; 363/21.01

(58) Field of Classification Search .................. 363/34, 363/20, 21.01, 15, 16, 95, 97
See application file for complete search history.

(56) References Cited

U.S. PATENT DOCUMENTS

| | | | |
|---|---|---|---|
| 4,979,087 A * | 12/1990 | Sellwood et al. ............... | 363/34 |
| 5,206,540 A | 4/1993 | de Sa e Silva et al. | |
| 5,781,040 A | 7/1998 | Myers | |
| 5,952,849 A | 9/1999 | Haigh et al. | |
| 5,966,297 A * | 10/1999 | Minegishi ..................... | 363/24 |
| 6,211,626 B1 | 4/2001 | Lys et al. | |
| 6,385,063 B1 * | 5/2002 | Sadek et al. .................. | 363/39 |
| 6,407,691 B1 | 6/2002 | Yu | |
| 6,888,322 B2 | 5/2005 | Dowling et al. | |
| 6,967,448 B2 | 11/2005 | Morgan et al. | |
| 6,975,079 B2 | 12/2005 | Lys et al. | |
| 7,064,498 B2 | 6/2006 | Dowling et al. | |
| 7,078,963 B1 | 7/2006 | Andersen et al. | |
| 7,135,824 B2 | 11/2006 | Lys et al. | |

(Continued)

FOREIGN PATENT DOCUMENTS

EP    1768257    3/2007

(Continued)

OTHER PUBLICATIONS

Linear Technology LTC3705 Datasheet, 2005 Linear Technology, Inc.

(Continued)

*Primary Examiner*—Bao Q Vu
(74) *Attorney, Agent, or Firm*—Andrew M. Harris; Mitch Harris, Atty at Law, LLC

(57) ABSTRACT

A modulated transformer-coupled gate control signaling method and apparatus provides reduction of circuit complexity and robust design characteristics in switching power circuits having a transformer-coupled gate drive. A modulated control signal at a rate substantially higher than the switching circuit gate control rate is provided from the controller circuit to a demodulator via transformer coupling. Power for the demodulator can be obtained by rectifying the modulated control signal at the demodulator, or from another transformer winding. The modulation scheme is chosen to have a DC average value of zero, eliminating any magnetization current management requirements. The modulated control signal may carry redundant control information and/or may encode additional information to provide a more sophisticated gate drive control, such as oversampled gate control information.

31 Claims, 7 Drawing Sheets

U.S. PATENT DOCUMENTS

| | | | |
|---|---|---|---|
| 7,255,457 B2 | 8/2007 | Ducharme et al. | |
| 7,382,635 B2 * | 6/2008 | Noda | 363/60 |
| 2002/0150151 A1 | 10/2002 | Krone et al. | |
| 2004/0046683 A1 | 3/2004 | Mitamura et al. | |
| 2004/0232971 A1 | 11/2004 | Kawasaki et al. | |
| 2008/0192509 A1 * | 8/2008 | Dhuyvetter et al. | 363/17 |

FOREIGN PATENT DOCUMENTS

| | | |
|---|---|---|
| EP | 1768257 A1 | 3/2007 |
| GB | 2262673 | 6/1993 |
| GB | 2262673 A | 6/1993 |
| WO | WO91/13417 | 9/1991 |
| WO | WO97/42714 | 11/1997 |

OTHER PUBLICATIONS

Dunn, Jamie, "Determining MOSFET Driver Needs for Motor Drive Applications", AN-898 Application note, 2003, Microchip Technology.

* cited by examiner

MODULATED TRANSFORMER-COUPLED GATE CONTROL SIGNALING METHOD AND APPARATUS

BACKGROUND OF THE INVENTION

1. Field of the Invention

The present invention relates generally to power switching circuits having a transformer-coupled gate control, and more specifically, to a gate drive control circuit using a control signal modulated to a rate higher than the switching rate.

2. Background of the Invention

Transformer coupling of gate drive control is used in power switching circuits in which the transformer gate control signal either requires complete DC isolation from the switching control circuit, or in which the gate control voltage for at least one of the switching transistors is sufficiently high with respect to the controller integrated circuit operating voltage that transformer coupling of the gate control signal relaxes the voltage-handling requirements for the control circuit drive output(s). The transformer can also be used to step up a lower voltage switching signal, so that the higher voltage required to drive the gate of at least one of the transistors is easily generated from a lower-voltage source. Such a single-side transformer coupled circuit is shown in U.S. Pat. No. 7,078,963 to Andersen, et al, in which a transformer is used to couple the control circuit to the positive side switching transistor.

However, such implementations typically require a relatively large number of passive components to complete the circuit, such as resistors, capacitors and/or snubbing/protection diodes to ensure that the gate of the transistor that is coupled to the transformer secondary is not damaged or improperly controlled, and that the transformer does not saturate due to a net DC magnetization current from duty cycles other than 50%.

Control of such a circuit is also typically complex. The required passive component values are dependent on the operating voltage ranges, static and Miller-effect transistor gate capacitance, which vary with operating conditions and environmental conditions such as temperature. In particular, the pulse width range that can be generated by such circuits is limited by the passive components, and if the output is to have a disabled state, such control must be provided by an additional circuit.

Therefore, it would be desirable to provide a transformer-isolated gate drive circuit that requires few or no passive components to achieve a wide pulse width range and has a robust characteristic over operating and environmental conditions. It would further be desirable to provide such a transformer-isolated gate drive circuit that can ensure operation of the transformer at substantially zero net magnetization current and that provides for the use of smaller transformers.

SUMMARY OF THE INVENTION

The above stated objective of providing a transformer-isolated gate drive circuit that requires few or no passive components to achieve a wide pulse width range with disable capability, is robust over environmental and operating conditions, provides substantially zero net magnetization current, and provides for use of smaller transformers, is achieved in a gate drive control circuit and method of operation. The circuit may be provided by a transformer and a set of integrated circuits, one of which provides the control signal on the primary side of the transformer, and the other of which provides the gate drive signal from the secondary side of the transformer.

On the primary side of the transformer, a control circuit generates a modulated control signal that is coupled to the primary winding of the transformer. A demodulator is provided on the secondary side of the transformer and is coupled to a secondary winding to demodulate the control signal impressed by the control circuit on the primary winding. Power for the demodulator may be derived by rectifying the signal from either another secondary winding, or the same secondary winding that provides the input to the demodulator. The modulated control signal is at a higher frequency than the actual gate control rate of the switching power stage, so that redundant information can be used to provide more robust control in the presence of noise, or so that additional information, e.g., oversampled information, can be used to provide a more sophisticated gate control. The modulation scheme is chosen to have a zero average DC voltage, so that no net magnetization current is generated in the transformer.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits and methods for providing drive signal(s) that control the gate(s) of one or more switching devices of a switching power stage. A transformer is used to isolate at least one gate drive circuit from a controller integrated circuit, and the control signal is modulated at a rate substantially higher than the switching control rate of the switching power stage, e.g., by a factor of 10, which permits transmission of additional or redundant information and robust operation with few additional components. Prior art transformer-isolated gate drive circuits typically passively couple the gate control signal(s) directly through the transformer and require additional components for shaping and snubbing the gate control signal. Variations in transformer characteristics from component to component and over environmental conditions, such as temperature, cause variation in the control signal(s). The present invention reduces the impact of such transformer characteristic variation by using the transformer to couple control information, rather than the actual gate drive signal. Further, the present invention reduces the number of components required to control the gate of one or more switching transistors using a transformer isolated control signal and enables a wider range of pulse width including totally disabling or enabling the switching transistor(s).

Power to operate a demodulating circuit that provides the gate control at the secondary side of the transformer can be obtained from the same winding used to receive the modulated gate control signal, or from an additional transformer winding. Since the control signal is transmitted at a higher rate than the control signal, the size and/or core permeability of the transformer can be reduced substantially, which is especially critical when transmitting high current signals for providing power that may otherwise saturate the transformer, causing error in the edge positions of the control signals and reduction of the control signal amplitude. Further, the type of modulation can be selected so that no net DC component is present in the control signal, further relaxing transformer core size/material requirements.

Figure 1A:
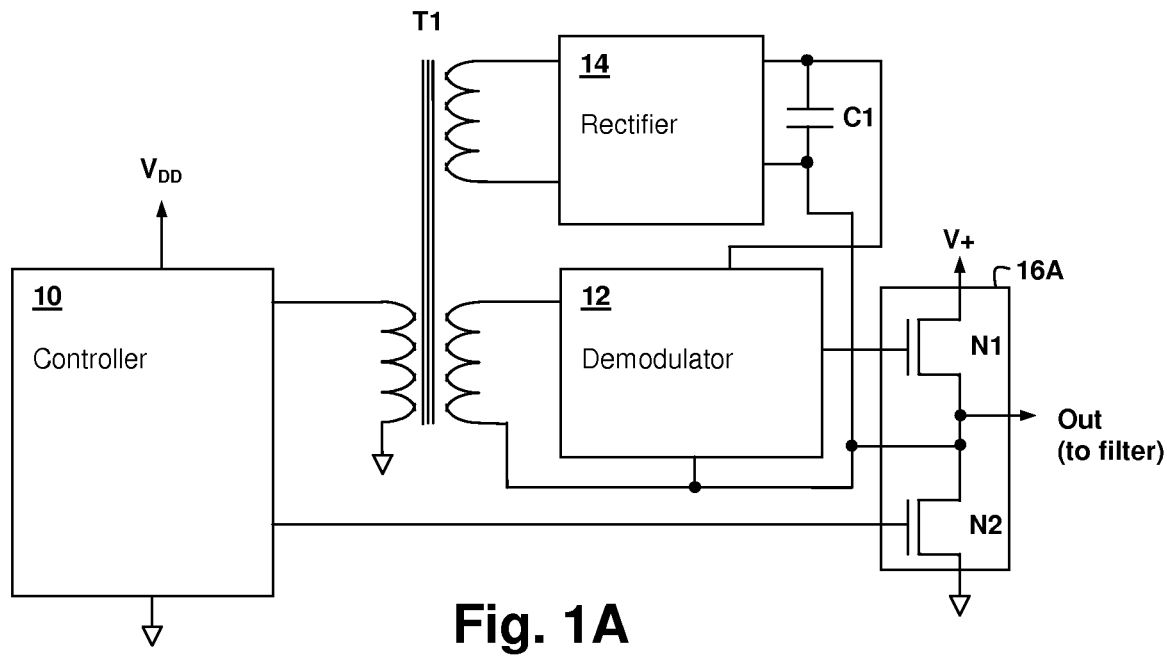
FIGS. 1A-1B are block diagrams depicting power switching circuits in accordance with embodiments of the present invention.

Referring now to FIG. 1A, a switching power circuit in accordance with an embodiment of the invention is shown. A controller 10, which may be a pulse-width modulator (PWM) including consecutive-edge modulators (CEMs) or other switching modulator type, such as a pulse frequency modulator (PFM), is coupled to a switching power stage 16A comprising power switching transistors N1 and N2. The gate of power switching transistor N1 is coupled to a controller circuit 10 by a transformer T1, and a demodulator 12 that decodes/demodulates gate control information present in a modulated control signal provided from controller 10 to a primary winding of transformer T1. The gate of power switching transistor N2 is coupled directly to controller 10 and is therefore provided at the switching control rate, rather than the modulated rate. A rectifier 14 is provided to generate a power supply voltage that is filtered by a capacitor C1, and supplied to demodulator 12. The negative rail of the output of rectifier 14 is connected to the drain of transistor N1, so that the gate control voltage generated by demodulator 12 "floats" to maintain the proper control voltage across the gate-drain terminals of transistor N1.

Figure 1B:
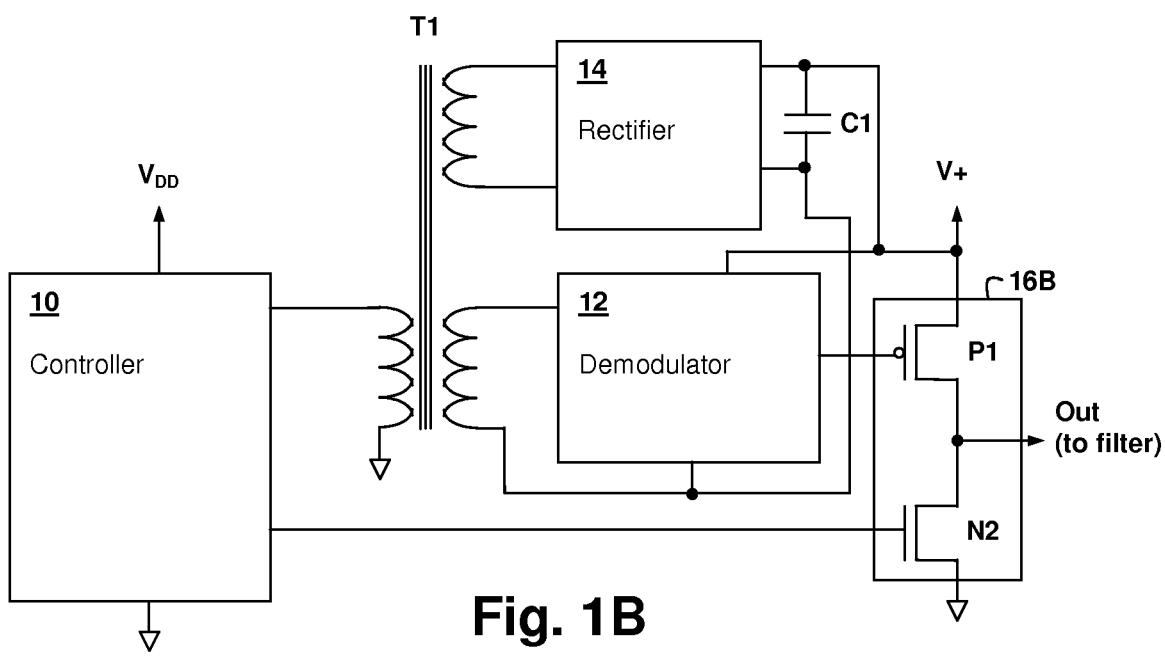

The circuit of FIG. 1A is isolated with respect to the output positive power supply rail and ground, so that controller 10 is not required to operate at the gate drive voltage that is needed to turn on power switching transistor N1 under all operating conditions. Further, by operating demodulator 12 with a power supply voltage that is generated by rectifier 14 and floated above the drain voltage of power switching transistor N1, low-voltage circuits can be used to implement demodulator 12 and rectifier 14, even if power supply voltage V+ is a relatively high voltage. The circuit of FIG. 1B is similar to the circuit of FIG. 1A, except that a P-channel transistor P1 is substituted for the positive-rail switch to form a switching power stage 16B. In the circuit of FIG. 1B, a high positive gate voltage is needed to completely turn off the P-channel transistor P1 under all operating conditions. Therefore, the positive output of rectifier 14 is referenced to the positive output power supply rail, so that a low-voltage supplied from rectifier 14 to demodulator 12 is sufficient to turn on transistor P1 when required and transistor P1 will be turned completely off when the output of demodulator 12 is set to voltage V+. The partially-isolated circuits of FIGS. 1A-1B are particularly applicable in applications such as switching power audio amplifiers and DC-DC converters. However, the techniques of the present invention may also be used to provide a fully-isolated switching power stage.

Figure 2A:
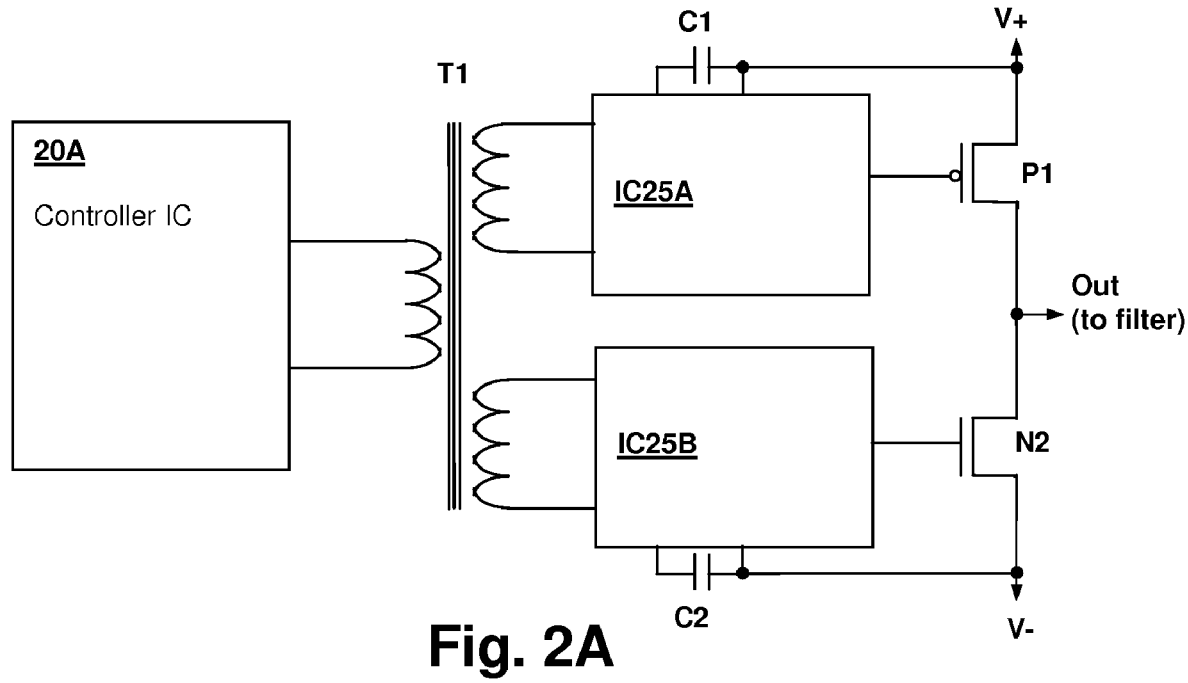
FIGS. 2A-2B are block diagrams depicting power switching circuits in accordance with other embodiments of the present invention.

Referring now to FIG. 2A, a switching power circuit in accordance with another embodiment of the invention is shown. The depicted embodiment fully isolates a controller IC 20A from the switching power stage using transformer T1. Demodulator integrated circuits IC25A and IC25B provide the gate control signals to transistors P1 and N2, respectively. As in the circuit of FIG. 1B, demodulator integrated circuit IC25A is referenced to the output positive power supply rail, and similarly, demodulator integrated circuit IC25B is referenced to the output negative power supply rail, so that both demodulator integrated circuits IC25A and IC25B can be implemented in low-voltage technology. The modulated control signal provided by controller IC 20A to transformer T1 has information that may be coded separately for demodulator integrated circuit IC25A and demodulator integrated circuit IC25B, for example, information coded in addition to the transition that indicates the switching time for transistors P1 and N2 may indicate that one or both of transistors P1 and N2 should be disabled or constantly enabled (100% duty-cycle) or may introduce an offset from the indicated switching time for one or both of transistors P1 and N2. Capacitors C1 and C2 filter the outputs of rectifier circuits included in demodulator integrated circuits IC25A and IC25B which are derived from the same windings as the modulated control signal. In the depicted embodiment, a single modulated control signal encodes the switching information needed to control both switching power transistors P1 and N2. However, separate modulated control signals may be provided to separate transformers coupling controller integrated circuit 20A to demodulator integrated circuits IC25A and IC25B.

Figure 2B:
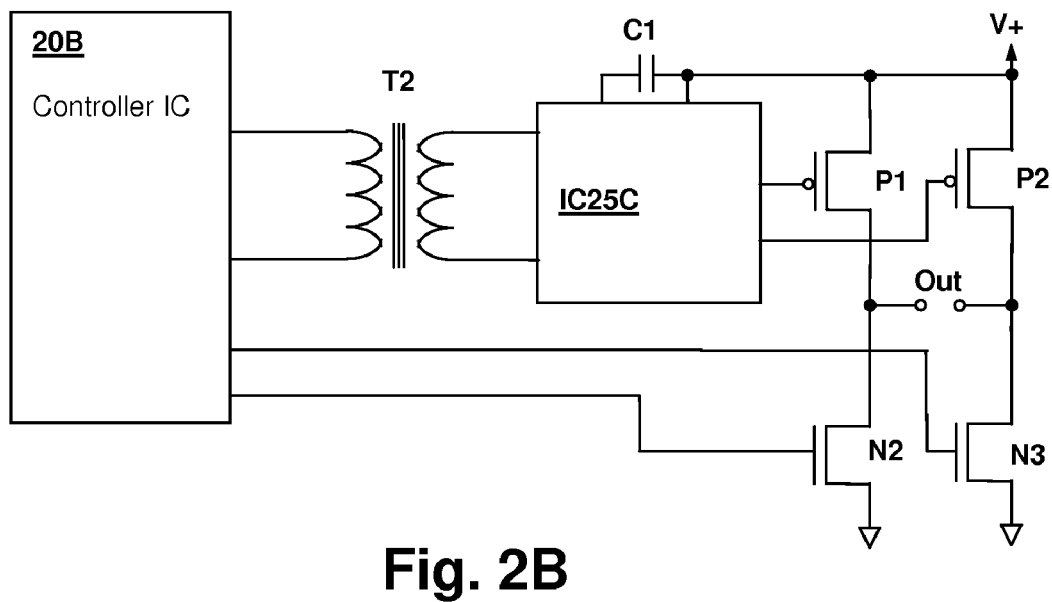

FIG. 2B illustrates a power switching circuit in accordance with yet another embodiment of the present invention. In the embodiment of FIG. 2B, a full-bridge switching circuit is implemented by transistor pairs P1,N2 and P2-N3. As in the circuit of FIG. 1B, only the P-channel (positive rail) switching transistors are isolated and controlled by the modulated control signal. Demodulator integrated circuit IC25C provides control of both power switching transistor P1 and P2, by decoding control information coupled through transformer T2, while power switching transistors N2 and N3 are controlled directly from controller integrated circuit 20B. Capacitor C1 filters the rectifier output of demodulator integrated circuit IC25C, which is referenced to the output positive power supply rail V+.

Figure 3:
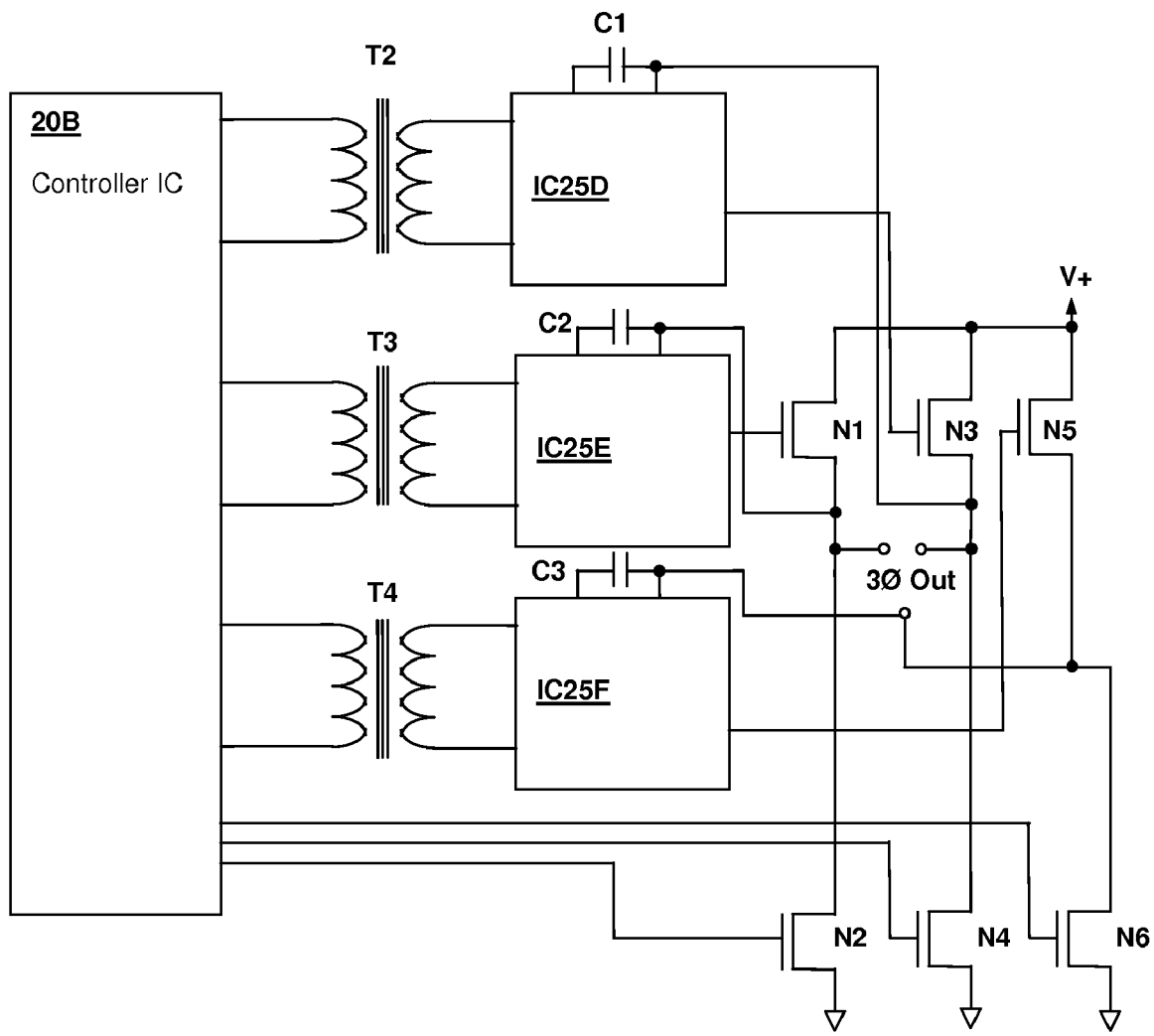
FIG. 3 is a block diagram depicting a power switching circuit in accordance with yet another embodiment of the present invention.

Referring now to FIG. 3, a power switching circuit in accordance with yet another embodiment of the present invention is shown. In the embodiment of FIG. 3, a three-phase switching circuit is implemented by transistor pairs N1-N2, N3-N4 and N5-N6. As in the circuit of FIG. 2, only the P-channel (positive rail) switching transistors are isolated and controlled by the modulated control signals, which are provided by independent transformers T2-T4. Three demodulator integrated circuits IC25D-IC25F provide independent control and biasing of power switching transistors N1, N3 and N5, respectively, by decoding control information coupled through corresponding transformers T2-T4. Power switching transistors N2, N4 and N6 are controlled directly from controller integrated circuit 20B. Capacitors C1-C3 filter the rectifier outputs of demodulator integrated circuits IC25D-IC25F, which are independently referenced to the drain of corresponding power switching transistors N1, N3 and N5, respectively. The embodiment of FIG. 3 thus provides for the use of N-channel devices in a three-phase control application, while maintaining low voltage gate control requirements for each of power switching transistors N1, N3 and N5. One transformer, demodulator circuit and switching transistor pair can be removed to provide a similar full-bridge configuration.

Figure 4:
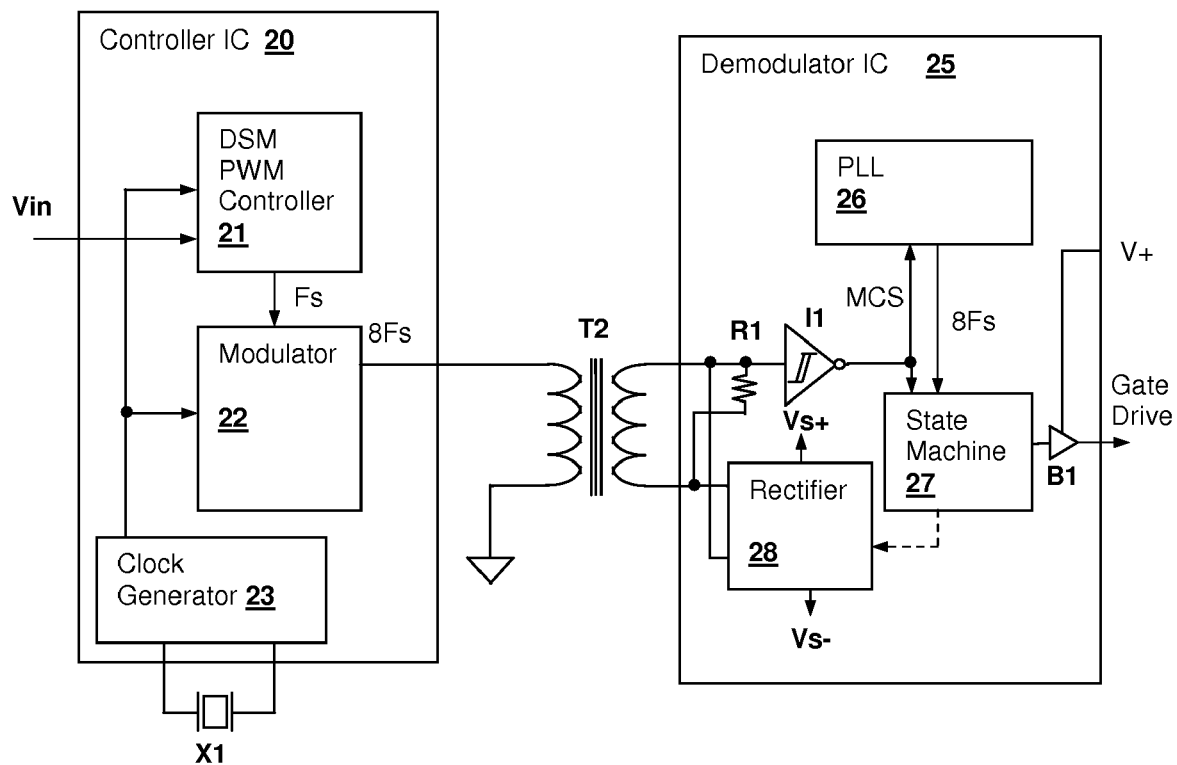
FIG. 4 is a block diagram depicting a power switching circuit in accordance with still another embodiment of the present invention.

Referring now to FIG. 4, a switching power circuit in accordance with still another embodiment of the invention is shown. The illustrated embodiment discloses structural details of demodulator IC 25 and controller IC 20 that may be used in the above-described embodiment illustrated in FIGS. 1A-3. The embodiment of FIG. 4 illustrates a "two-chip" solution with little or no external components required, other than transformer T2 and the power switching transistor(s). Other packaging arrangements are possible, including single IC and discrete/multi-IC implementations and are contemplated by the present invention. Therefore, the implementation illustrated in FIG. 4 is illustrative of only one possible device packaging arrangement and is not limiting as to the scope of the invention. A crystal X1, is shown connected to controller IC 20 to provide a reference for internal clock generator 23, but an internal clock circuit may alternatively be used, further reducing external component requirements. Controller IC 20 receives an input signal Vin and converts the voltage of the input signal to a pulse width modulated signal using a delta-sigma modulator (DSM) based pulse width modulator (PWM) controller 21 at the switching frequency Fs. A modulator 23 converts the output of DSM PWM controller 21 to a higher rate, illustrated as 8Fs, which is provided to the primary winding of transformer T2.

In practice, the modulating function in controller IC 20 will generally be performed by the same logic that generates the pulse width modulated control information, and extra information can be inserted, for example to control two switching transistors as illustrated in FIG. 2B, or to provide extra control information to control transistor gate compensation circuits, or perform other control operations. Redundant information can also be provided, for example, the simplified illustrated example provides 8 cycles of control signal for each switching period, which may be effectively combined to determine the actual switching time.

Demodulator IC 25 includes a rectifier 28, which may be a passive rectifier such as a bridge that supplies power supply voltages Vs+ and Vs−. Alternatively, rectifier 28 may be a switched rectifier that receives a control signal from state machine 27 so that the polarity of the rectification is controlled according to the expected polarity of modulated control signal MCS. Modulated control signal is extracted from the secondary winding of transformer T2 by a circuit including load resistor R1 and Schmitt inverter I1. A phase-locked loop (PLL) 26 is included to provide a clock reference at 8Fs to state machine 27, but can also perform decoding functions as will be illustrated in further detail below. Other reference clock generator circuits, such as delay-locked loops (DLLs), may be alternatively employed. State machine 27 decodes information in modulated control signal MCS to provide a gate drive signal input to buffer B1, which has an output operated from the switching power stage positive power supply rail, which is generally a higher voltage than power supply rail Vs+.

Figure 5A:
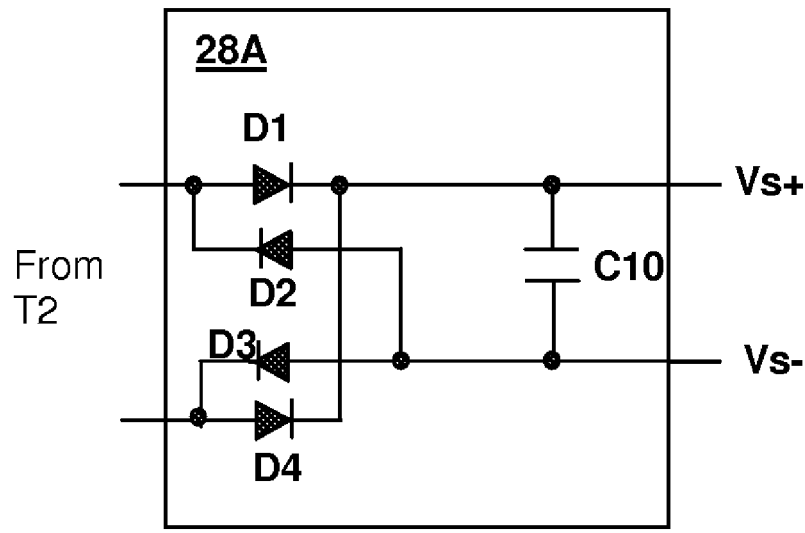
FIGS. 5A-5B are schematic diagrams showing rectifier circuits that may be used to implement rectifier circuits 14 and 28 of FIGS. 1A-1B.

Referring now to FIG. 5A, a rectifier circuit 28A that may be used to implement rectifier circuit 14 of FIG. 1 and FIG. 2 and rectifier circuit 28 of FIG. 4 is shown. Diodes D1-D4 form a full-wave bridge and capacitor C10 filters the rectified modulated control signal to provide DC power supply outputs Vs+ and Vs−. Capacitor C10 may be provided external to the integrated circuit package that includes the demodulator and rectifier circuits.

Figure 5B:
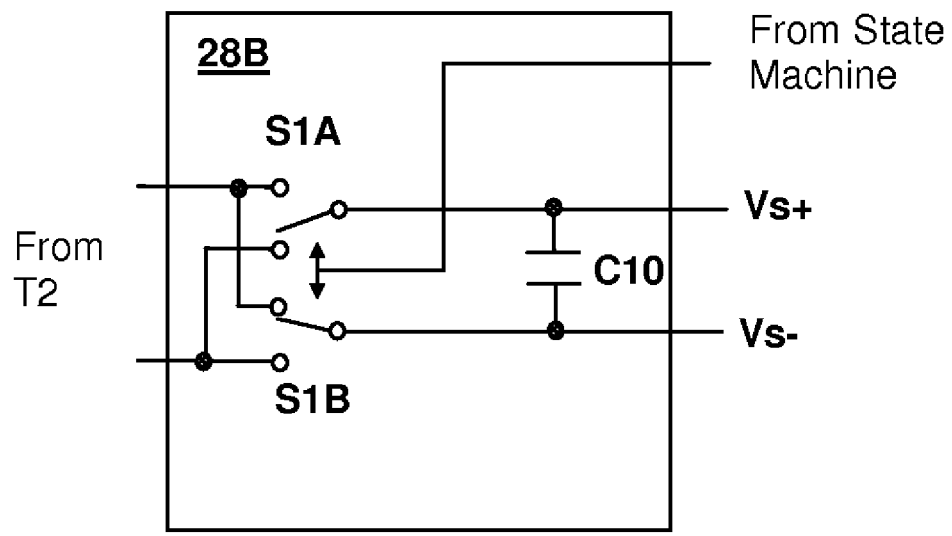

Referring now to FIG. 5B, a rectifier circuit 28B that may be used to implement rectifier circuit 28 of FIG. 4 is shown. Switches S1A and S1B are controlled by a signal provided from state machine 27 to control the rectification polarity according to the expected (or actual detected) polarity of modulated control signal MCS. Capacitor C10 filters the output of switches S1A and S1B to provide DC power supply outputs Vs+ and Vs−.

Figure 6A:
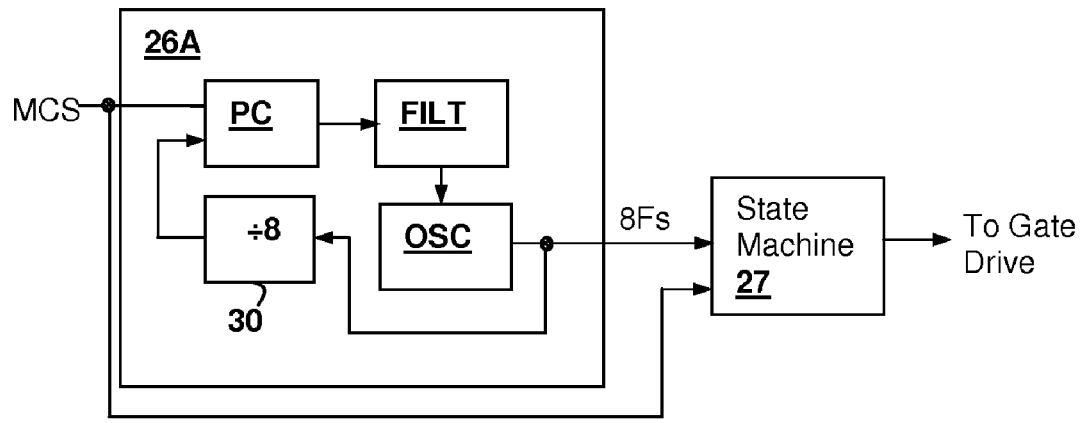
FIGS. 6A-6B are schematic diagrams showing PLL configurations that may be used to implement demodulator ICs 25 and 25A-25E of FIGS. 2A-4 and demodulator 12 of FIGS. 1A-1B.
Figure 6B:
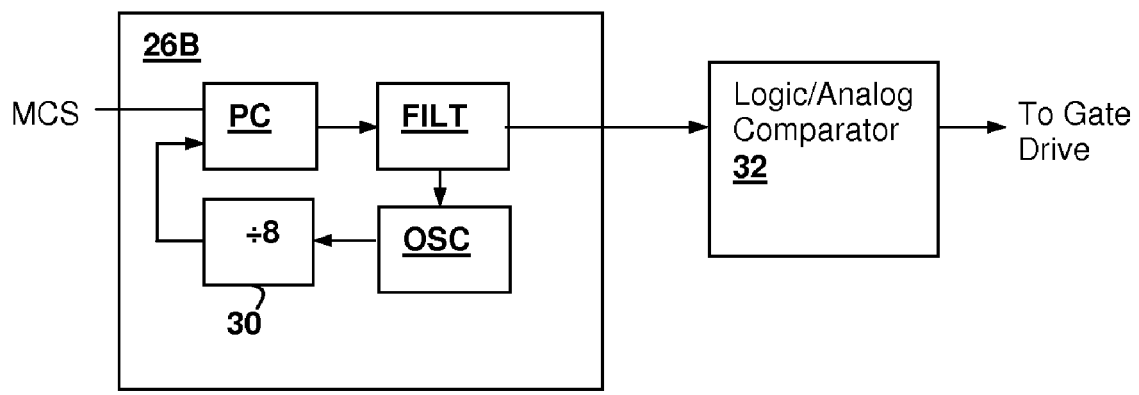

Referring now to FIG. 6A and FIG. 6B, PLL configurations for use in the demodulator circuits of FIGS. 1-4 are shown. FIG. 6A illustrates a PLL circuit 26A that generates a reference clock at a frequency 8Fs from a modulated control signal MCS at frequency Fs. A phase comparator PC compares the output of a divider 30 that divides the output of an oscillator OSC by eight. A filter FILT filters the output of phase comparator PC to provide a stable reference clock output from oscillator OSC, which is provided to state machine 27. State machine, as described above with reference to FIG. 4, decodes modulated control signal MCS to generate a gate drive control signal to control at least one power switching transistor. FIG. 6B illustrates an alternative PLL configuration employing PLL circuit 26B to detect changes in modulation control signal MCS. A logic and/or analog comparator circuit 32 detect changes at an output of filter FILT that indicate, for example, a frequency shift in modulation control signal MCS. Logic and/or analog comparator circuit 32 generate a gate drive control signal to control at least one power switching transistor.

Figure 7:
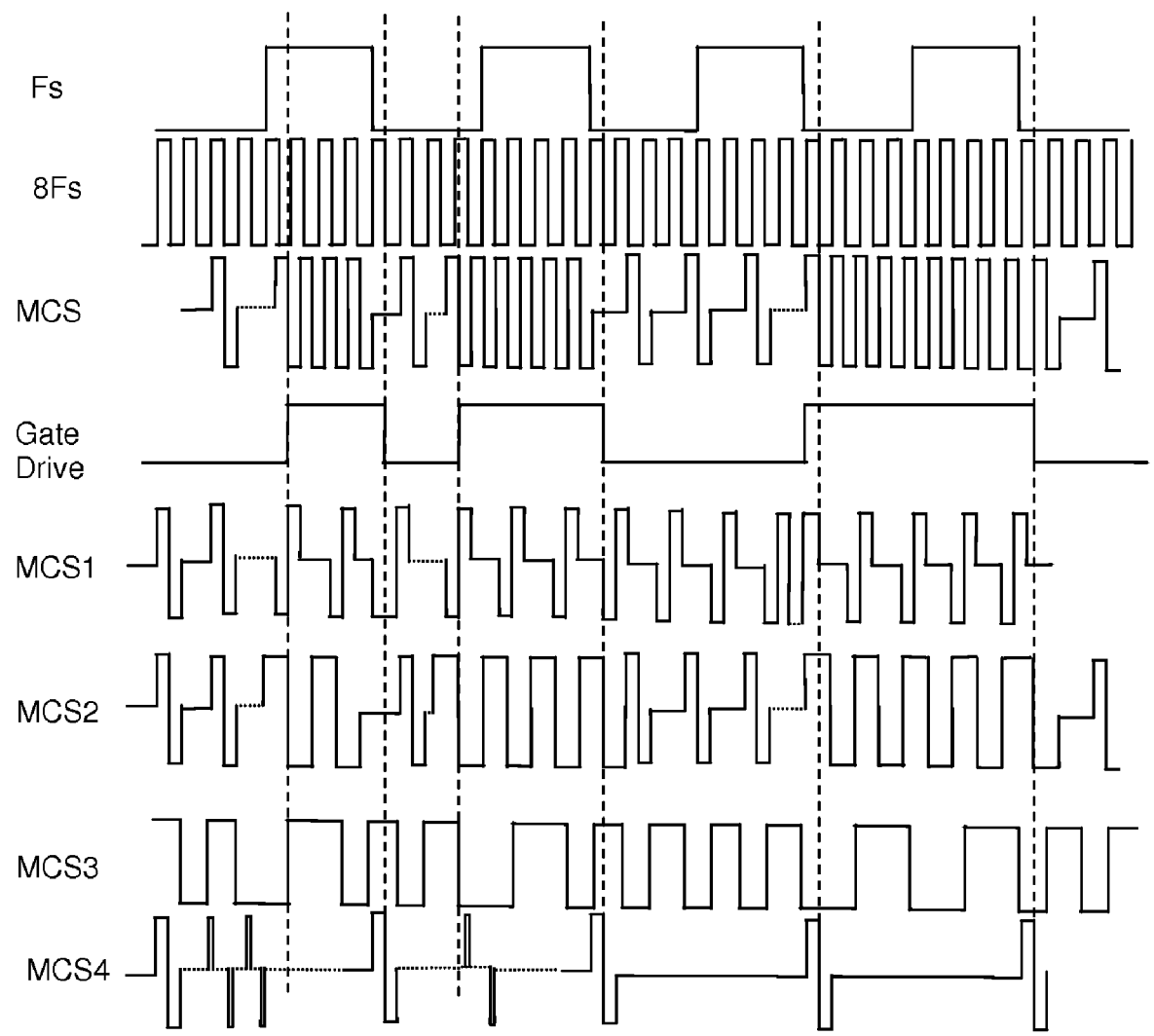
FIG. 7 is a signal waveform diagram depicting signals within the circuits depicted in FIGS. 1A-4.

Referring now to FIG. 7, a signal diagram is shown that illustrates operation of the above-described modulated control scheme. Signal Fs is provided for illustration of the switching frequency/period. Signal 8Fs is a reference signal generated by a PLL for detection of one of modulation control signals MCS, MCS1, MCS2, MCS3 or MCS4 to generate gate drive signal Gate Drive. Modulation control signals MCS, MCS1, MCS3 or MCS4 are not an exhaustive example of types of modulated control signals that may be used in the present invention, but are provided as illustrations of signals that meet a desired condition of having a net DC value of zero.

Modulation control signal MCS illustrates a frequency modulation technique having constant width pulses. The leading edge of signal Gate Drive is triggered by the first falling edge of the higher-frequency interval, and the trailing edge is fixed according to the end of the switching period Fs. Modulation control signal MCS1 illustrates a phase modulation technique having constant width positive-negative pulse pairs that are inverted in phase to indicate a change. The leading edge of signal Gate Drive is triggered by the first positive transition of MSC1 following a phase reversal, and the trailing edge is fixed according to the end of the switching period Fs.

Modulation control signal MCS2 illustrates a pulse width modulation technique. The leading edge of signal Gate Drive is triggered by the first falling edge of the wider pulse interval, and the trailing edge is fixed according to the end of the switching period Fs. Modulation control signal MCS3 illustrates a frequency modulation technique having variable width pulses. The leading edge of signal Gate Drive is triggered by the first rising edge of the wider pulse/lower frequency interval. Redundant information is present in the above-described signals, according to the repetition of the frequency/phase/pulse-width states. However, additional information (instead of or in conjunction with redundant information) can be inserted by combining modulation techniques and/or changing modulation states at points in time other than at the gate drive triggering event.

Modulation control signal MCS4 illustrates a digitally encoded modulation technique in which the turn-on time and turn-off times of the switching power stages are not fixed by the edge positions of the modulated control signal at the switching rate, as is the case in the exemplary signals described above. Modulation control signal MCS4 encodes the switching information at a higher resolution that is decoded at the modulated rate, while the reference clock that is used to decode the switching information is synchronized at the switching rate (or alternatively at another multiple of the switching rate). For example, in illustrated modulation control signal MCS4, a set of fixed position pulses are provided at the end of each switching rate period to synchronize the reference clock. Between the fixed position pulses, other pulses are inserted to encode the relative timing to provide information for setting the switching times of a next switching period. Presence or absence of pulses in certain periods of the modulated rate can be used to indicate whether switching of a particular transistor should occur at all, in order to disable one or more of the switching circuits, such as the total absence of additional pulses in the last two switching control periods to the right of the Figure. Other states can indicate setting one or more switching transistors to their "on" state (100% duty cycle). The additional pulses can also have lowered amplitude in order to facilitate decoding the synchronization pulses.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit, comprising:
   a switching power stage for producing a switched power output at a switching rate and having at least one power switching transistor;
   a switching control circuit for determining a turn-on time and a turn-off time of the at least one power switching transistor at the switching rate, and having an output generated at a modulated rate that is greater than the switching rate;
   a transformer for coupling the output of the switching control circuit to the at least one power switching transistor, whereby the at least one transistor has a gate that is DC isolated from the switching control circuit, wherein a first winding of the transformer is connected to the switching control circuit; and
   a demodulator circuit connected to at least one second winding of the transformer and having an output coupled to the gate of the at least one power switching transistor, wherein the output of the demodulator is at least one gate control signal generated at the switching rate from a control signal received from the at least one second winding at the modulated rate, and wherein a single period of the at least one gate control signal is generated in conformity with redundant or differing information contained in multiple periods of the output of the switching control circuit.

2. The circuit of claim 1, further comprising a rectifier circuit connected to the at least one second winding of the transformer for generating a DC voltage from the control signal present on the at least one second winding at the modulated rate, wherein an output of the rectifier circuit provides power to the demodulator circuit.

3. The circuit of claim 1, wherein the turn-on time and turn-off time of the at least one power switching transistor are determined by the demodulator circuit from differing information provided in multiple periods of the control signal.

4. The circuit of claim 1, wherein redundant information specifying the turn-on time and turn-off time of the at least one power switching transistor is provided by the output of the switching control circuit in multiple periods of the control signal.

5. The circuit of claim 1, wherein the demodulator circuit comprises a reference clock generator for generating a reference clock having a rate substantially higher than the switching rate.

6. The circuit of claim 5, wherein the demodulator circuit further comprises logic for storing information provided in multiple periods of the control signal and for determining the turn-off time and turn-on time of the at least one power switching transistor from the stored information.

7. A method for controlling a switching power stage, comprising:
   generating a modulated control signal for controlling a turn-on time and a turn-off time of a transistor of the switching power stage at a switching rate of the switching power stage, wherein the modulated control signal is generated at a modulated rate greater than the switching rate of the switching power stage;
   transformer isolating the modulated control signal to provide a DC isolated control signal to at least one power switching transistor of the switching power stage; and
   demodulating the DC isolated control signal from the modulated rate to generate at least one gate control signal that controls the at least one power switching transistor at the switching rate, and wherein a single period of the at least one gate control signal is generated in conformity with redundant or differing information contained in multiple periods of the modulated control signal.

8. The method of claim 7, further comprising generating a DC power supply from a winding of the transformer to operate a demodulator for performing the demodulating.

9. The method of claim 7, wherein the at least one power switching transistor is a first switching device of the switching power stage and further comprising providing another control signal directly from an integrated circuit that provides the control signal to control a second switching device of the switching power stage that is not transformer isolated.

10. The method of claim 7, wherein the demodulating determines the turn-on time and turn-off time of the at least one power switching transistor from differing information provided in multiple periods of the modulated control signal.

11. The method of claim 10, wherein the demodulating comprises generating a reference signal from the modulated control signal at a rate substantially higher than the switching rate.

12. The method of claim 11, further comprising:
   detecting information in multiple periods of the modulated control signal using the reference signal; and
   controlling the turn-on time and the turn-off time of the transistor of the switching power stage in conformity with the detected information.

13. An integrated circuit, comprising:
   a pair of terminals for connection to an output winding of a transformer having a control signal imposed from an input winding carrying information for controlling a switching power stage, wherein the switching power stage produces a switched power output at a switching rate and includes at least one power switching transistor, and wherein the control signal carries said information at a modulated rate that is greater than the switching rate; and
   a demodulator circuit having inputs coupled to the pair of terminals and having an output coupled to a driver circuit for controlling the gate of the at least one power switching transistor, wherein the output of the demodulator is at least one gate control signal generated at the switching rate from a signal received by the pair of terminals from the output winding that contains the information at the modulated rate, and wherein a single period of the at least one gate control signal is generated in conformity with redundant or differing information contained in multiple periods of the control signal.

14. The integrated circuit of claim 13, further comprising a rectifier circuit connected to the pair of terminals for generating a DC voltage from the control signal, wherein an output of the rectifier circuit provides power to the demodulator circuit.

15. The integrated circuit of claim 13, wherein a turn-on time and turn-off time of the at least one power switching transistor are determined by the demodulator circuit from differing information provided in multiple periods of the control signal.

16. The integrated circuit of claim 13, wherein redundant information specifying a turn-on time and turn-off time of the at least one power switching transistor are detected by the demodulator circuit in multiple periods of the output of the control signal.

17. The integrated circuit of claim 13, wherein the demodulator circuit comprises a reference clock generator for generating a reference clock having a rate substantially higher than the switching rate.

18. The integrated circuit of claim 13, further comprising:
at least one additional pair of terminals for connection to an output winding of at least one other transformer for imposing at least one other control signal for controlling at least one other corresponding switching power stage, wherein the at least one other control signal also carries information at a modulated rate that is greater than the switching rate; and
at least one additional demodulator having inputs coupled to the at least one additional pair of terminals and having an output coupled to at least one other driver circuit for controlling the gate of the at least one other power switching transistor, wherein the output of the at least one other demodulator is another gate control signal generated at the switching rate from a signal received by the at least one other pair of terminals.

19. The integrated circuit of claim 18, wherein the at least one additional pair of terminals comprises two pairs of terminals, wherein the at least one transformer comprises two transformers, and wherein the at least one other corresponding switching power stage comprises two switching power stages, whereby three-phase power switching control is provided.

20. An integrated circuit, comprising:
a pair of terminals for connection to an input winding of a transformer for imposing a control signal carrying information for controlling a switching power stage coupled to an output winding of the transformer, wherein the switching power stage produces a switched power output at a switching rate and includes at least one power switching transistor, and wherein the control signal carries said information at a modulated rate that is greater than the switching rate; and
a switching control circuit having an output coupled to at least one of the pair of terminals for determining a turn-on time and a turn-off time of the at least one power switching transistor and generating the control signal at a modulated rate that is greater than the switching rate, and wherein the control signal encodes redundant or differing information in multiple periods of the control signal for generating at least one gate control signal that controls the at least one power switching transistor.

21. The integrated circuit of claim 20, wherein the turn-on time and turn-off time of the at least one power switching transistor are encoded in the control signal by differing information provided in multiple periods of the output of the switching control circuit.

22. The integrated circuit of claim 20, wherein redundant information specifying the turn-on time and turn-off time of the at least one power switching transistor is provided by the output of the switching control circuit in multiple periods of the output of the switching control circuit.

23. The integrated circuit of claim 20, further comprising at least one additional terminal for supplying a control signal coupled via a direct current path to a gate of a transistor of the switching power stage.

24. The integrated circuit of claim 20, further comprising at least one additional pair of terminals for connection to an input winding of at least one other transformer for imposing at least one other control signal for controlling at least one other corresponding switching power stage coupled to an output winding of the at least one other transformer, and wherein the at least one other control signal also carries information at a modulated rate that is greater than the switching rate.

25. The integrated circuit of claim 24, wherein the at least one additional pair of terminals comprises two pairs of terminals, wherein the at least one transformer comprises two transformers, and wherein the at least one other corresponding switching power stage comprises two switching power stages, whereby three-phase power switching control is provided.

26. The integrated circuit of claim 20, wherein the at least one power switching transistor comprises multiple power switching transistors, wherein the at least one gate control signal comprises multiple corresponding gate control signals, and wherein the control signal encodes differing information in multiple periods of the control signal for generating the multiple corresponding gate control signals.

27. The circuit of claim 1, wherein the at least one power switching transistor comprises multiple power switching transistors, wherein the at least one gate control signal comprises multiple corresponding gate control signals, and wherein the control signal encodes differing information in multiple periods of the control signal for generating the multiple corresponding gate control signals.

28. The method of claim 7, wherein the at least one power switching transistor comprises multiple power switching transistors, and wherein the demodulating generates the multiple corresponding gate control signals from differing information encoded in the control signal.

29. The integrated circuit of claim 13, wherein the at least one power switching transistor comprises multiple power switching transistors, and wherein the at least one gate control signal comprises multiple corresponding gate control signals, and wherein the control signal encodes differing information in multiple periods of the control signal for generating the multiple corresponding gate control signals.

30. A circuit, comprising:
a switching power stage for producing a switched power output at a switching rate and having at least one power switching transistor;
a switching control circuit for determining a turn-on time and a turn-off time of the at least one power switching transistor at the switching rate, and having an output generated at a modulated rate that is greater than the switching rate;

a transformer for coupling the output of the switching control circuit to the at least one power switching transistor, whereby the at least one transistor has a gate that is DC isolated from the switching control circuit, wherein a first winding of the transformer is connected to the switching control circuit; and a demodulator circuit connected to at least one second winding of the transformer and having an output coupled to the gate of the at least one power switching transistor, wherein the output of the demodulator is at least one gate control signal generated at the switching rate from a control signal received from the at least one second winding at the modulated rate, and wherein the control signal encodes further information provided at a second output of the demodulator.

31. A method for controlling a switching power stage, comprising:

generating a modulated control signal for controlling a turn-on time and a turn-off time of a transistor of the switching power stage at a switching rate of the switching power stage, wherein the modulated control signal is generated at a modulated rate greater than the switching rate of the switching power stage;

transformer isolating the modulated control signal to provide a DC isolated control signal to at least one power switching transistor of the switching power stage; and demodulating the DC isolated control signal from the modulated rate to generate at least one gate control signal that controls the at least one power switching transistor at the switching rate from first information encoded in the modulated control signal and generating at least one other signal from second information encoded in the modulated control signal.

* * * * *